(12) United States Patent
Chaudhary

(10) Patent No.: US 6,232,233 B1
(45) Date of Patent: *May 15, 2001

(54) METHODS FOR PERFORMING PLANARIZATION AND RECESS ETCHES AND APPARATUS THEREFOR

(75) Inventor: Nirmal Chaudhary, Wappingers Falls, NY (US)

(73) Assignee: Siemens Aktiengesellschaft, Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/940,806

(22) Filed: Sep. 30, 1997

(51) Int. Cl.$^7$ ................................................. H01L 21/302
(52) U.S. Cl. ........................... 438/706; 438/707; 438/710; 438/714; 438/719
(58) Field of Search .................................. 438/700, 706, 438/712, 717, 734, 735, 386, 702, 725, 731, 387, 388, 389; 216/68

(56) References Cited

U.S. PATENT DOCUMENTS

| | | | |
|---|---|---|---|
| 5,422,294 | * 6/1995 | Noble, Jr. .............................. | 438/386 |
| 5,521,114 | * 5/1996 | Rajeevakumar ..................... | 438/386 |
| 5,618,745 | * 4/1997 | Kita ...................................... | 438/386 |
| 5,683,945 | * 11/1997 | Penner et al. ........................ | 438/702 |
| 5,759,920 | * 6/1998 | Burns, Jr. et al. ................... | 438/734 |
| 5,792,686 | * 8/1998 | Chen et al. ........................... | 438/387 |
| 5,811,022 | * 9/1998 | Savas et al. .......................... | 438/731 |

OTHER PUBLICATIONS

"Semiconductor Integrated Circuit Processing Technology", Runyan et al., Addison–Wesley Publishing Company, 1990, pp. 269–273.
"VLSI Technology", Second Edition, S.M. Sze, McGraw–Hill Book Company, 1988, pp. 184–232.
Wolf, Dry Etch for the VLSI Fabrication, vol. 1, p. 541, 1986.*

* cited by examiner

Primary Examiner—Benjamin L. Utech
Assistant Examiner—Duy-Vu Deo
(74) Attorney, Agent, or Firm—Stanton Braden

(57) ABSTRACT

A method, in an RF-based plasma processing chamber 600, for performing a planarization etch and a recess etch of a first layer on a semiconductor wafer 614. The method includes placing the semiconductor wafer, including a trench formed therein, into the plasma processing chamber. The method also includes depositing the first layer over a surface of the semiconductor and into the trench. There is further included performing the planarization etch to substantially planarize the first layer in the plasma processing chamber, the planarization etch being performed with a first ion density level. Additionally, there is included performing, using the plasma processing chamber, the recess etch on the first layer to recess the first layer within the trench. The recess etch is performed with a second ion density level in the plasma processing chamber, with the second ion density level being higher than the first ion density level.

20 Claims, 5 Drawing Sheets

METHODS FOR PERFORMING PLANARIZATION AND RECESS ETCHES AND APPARATUS THEREFOR

BACKGROUND OF THE INVENTION

The present invention relates to the manufacture of semiconductor integrated circuits. More particularly, the present invention relates to improved techniques for performing planarization and recess etches during the manufacture of integrated circuits, which advantageously minimizes costs, device damage due to charging, and improves throughput.

The sequence of planarization and recess etches is required in the manufacture of a variety of integrated circuits (ICs). By way of example, in the manufacture of dynamic random access memory (DRAM) integrated circuits, trench capacitors may be formed by repeated sequences of deposition, chemical-mechanical planarization, and recess etch. To facilitate discussion, FIGS. 1–3 illustrate a simplified sequence of deposition, chemical-mechanical planarization, and recess etch that may be employed in the prior art to fabricate a trench capacitor in a DRAM. Referring initially to FIG. 1, a substrate 102, typically comprising silicon, is thermally oxidized to form a layer of silicon dioxide ($SiO_2$) 104 (which may be about 10 nm thick). Above oxide layer 104, a layer of silicon nitride 106 is blanket deposited.

A conventional photoresist mask is then formed on the surface of the substrate to facilitate etching trench 108 in substrate 102 through silicon nitride layer 106 and oxide layer 104. After the photoresist mask is removed, a polysilicon fill step is employed to deposit polysilicon over the top surface of substrate 102 and into trench 108. In FIG. 1, this polysilicon fill layer is shown as polysilicon layer 110. To facilitate the subsequent recess etch of the polysilicon material in trench 108 and to planarize the top surface of polysilicon layer 110, a chemical-mechanical polish (CMP) step may be performed next. The CMP of polysilicon layer 110 typically employs silicon nitride layer 106 as a CMP etch stop.

In FIG. 2, polysilicon layer 110 has been planarized down to the top surface of silicon nitride layer 106. However, a column of polysilicon material remains in trench 108. Subsequently, a reactive ion etching (RIE) etch step is employed to recess etch the polysilicon column within trench 108.

In FIG. 3, the RIE etch has removed a portion of the polysilicon column within trench 108. The photoresist mask has also been removed in FIG. 3. As can be seen in FIGS. 1–3, after the sequence of deposition (FIG. 1) chemical-mechanical planarization (FIG. 2) and recess etch (FIG. 3), a polysilicon plug is formed within trench 108. The sequence of deposition, chemical-mechanical planarization, and recess etch may be repeated multiple times to facilitate the formation of the trench capacitor.

There are, however, disadvantages associated with the sequence of deposition, chemical-mechanical planarization, and recess etch described in FIGS. 1–3. By way of example, the use of a CMP step to planarize polysilicon layer 110 may at times causes dishing into the trench (i.e., a slight depression into the trench), which results in a loss of recess depth control and process difficulties at later stages. The dishing effect may be seen in FIG. 2, which shows a depression over the silicon plug in trench 108.

The CMP step also has a low selectivity to nitride and causes erosion of pad nitride layer 106. If silicon nitride layer 106 is employed as the CMP etch stop for multiple CMP steps, an excessive amount of nitride erosion may result, possibly rendering the device defective. Further, the CMP etch step may cause nonuniform erosion of silicon nitride layer 106, which also causes difficulties in subsequent process steps. CMP is also widely known as an expensive process, i.e., it disadvantageously requires costly tools and reduces wafer throughput. The CMP process also disadvantageously generates particulate contamination in the form of a slurry, which requires time-consuming cleaning and drying steps afterward.

Not only is the prior art CMP step expensive, the reactive ion etching (RIE) step employed to recess etch the polysilicon column in trench 108 also requires its own costly RIE tools. The use of a RIE technique to recess etch the polysilicon material in trench 108 also causes additional and/or nonuniform erosion of silicon nitride layer 106 since the RIE etch tends to be a physical etch in which the bombarding ions tend to have a low selectivity to nitride.

Conventional recess etch techniques that have a good selectivity to nitride also have their problems. For example, although isotropic etch techniques (i.e., those which employ the reactive neutrals as the main etching mechanism) tend to have good selectivity to nitride, these isotropic etch processes tend to result in the amplification of voids or seams in the polysilicon column within trench 108. This is because the polysilicon fill step that forms polysilicon layer 110 in FIG. 1 may create seams or voids in trench 108 if the polysilicon deposition process is not carefully designed or if the aspect ratio of trench 108 is particularly aggressive. The seam or void is shown in FIG. 4 as a void 402. If a purely or dominantly isotropic tool is subsequently employed to recess the polysilicon column in trench 108, lateral attack (which is caused by the presence of the neutral species in the plasma of the isotropic etch) may amplify the void, causing a loss of depth control during the recess etch. To illustrate the foregoing, the lateral attack mechanism is depicted in FIG. 5 in which void 402 is amplified due to the isotropic etch action of the reactive neutral species present in the plasma of the isotropic etch step.

As can be appreciated from the foregoing, there are desired improved techniques for performing the planarization/recess etch sequence which advantageously offers a high degree of etch depth control while minimizing erosion to the silicon nitride layer. The improved techniques and apparatus therefor preferably accomplish the foregoing while minimizing costs, reducing device damage due to charging, and improving wafer throughput.

SUMMARY OF THE INVENTION

The invention relates, in one embodiment, to a method for performing a planarization etch and a recess etch of a first layer on a semiconductor wafer in an RF-based plasma processing chamber. The method includes placing the semiconductor wafer, including a trench formed therein, into the plasma processing chamber. The method also includes depositing the first layer over a surface of the semiconductor and into the trench. There is further included performing the planarization etch to substantially planarize the first layer in the plasma processing chamber, the planarization etch being performed with a first ion density level. Additionally, there is included performing, using the plasma processing chamber, the recess etch on the first layer to recess the first layer within the trench. The recess etch is performed with a second ion density level in the plasma processing chamber, with the second ion density level being higher than the first ion density level.

In another embodiment, the invention relates to an RF-based plasma processing system configured for performing a planarization etch and a recess etch of a first layer on a semiconductor wafer. The RF-based plasma processing system includes a chamber configured for containing a plasma, with the plasma being configured to etch the wafer. The RF-based plasma processing system also includes a coil disposed outside the chamber. The coil is configured to inductively couple with the plasma within the chamber when the coil is energized. The RF-based plasma processing system further includes a variable electric field shield disposed between the chamber and the coil. The variable electric field shield is configured to vary an amount of electric field penetrating into the chamber, thereby varying the ion density of the plasma in the chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention will now be described in detail with reference to a few illustrative embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 2:
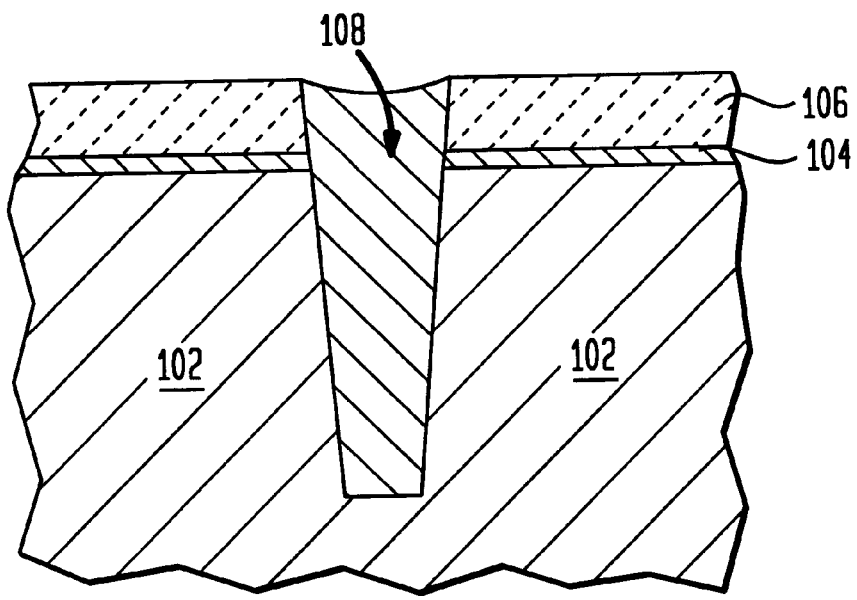
Figure 3:
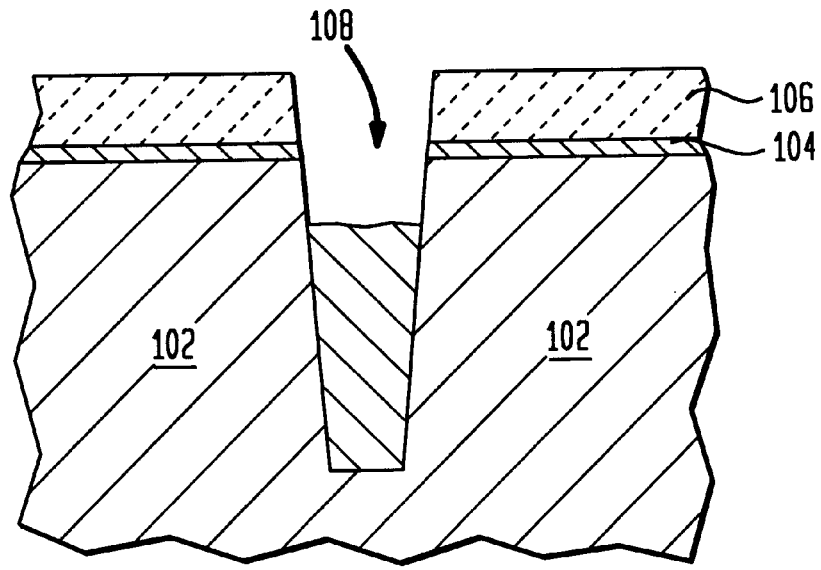

In accordance with one aspect of the present invention, there are provided improved techniques for performing the planarization/recess etch sequence which advantageously minimizes costs, device damage due to charging, while improving wafer throughput. Instead of employing two different tools, e.g., a CMP tool and a RIE tool as in the case of prior art FIGS. 1–3, the invention facilitates the planarization etch and the recess etch in a single plasma processing chamber. The planarization etch is performed in a substantially isotropic manner while the subsequent recess etch, employing a different set of parameters, recesses the polysilicon column using a more anisotropic etch.

In accordance with one aspect of the present invention, the planarization etch is performed using an RF-based tool which planarizes the polysilicon layer down to the nitride layer using a plasma that has a relatively low ion density. Once the polysilicon layer is planarized down to the top surface of the silicon nitride layer, an ion-assisted recess etch is performed using the same RF-based tool, albeit employing a plasma that has a higher ion density.

The relatively low ion density in the plasma of the planarization etch ensures that the etch profile is substantially planar while its high selectivity to nitride ensures a minimum level of nitride erosion. On the other hand, the higher ion density in the plasma of the ion-assisted recess etch step increases the directionality of the recess etch to minimize amplification of voids during the polysilicon recess etch. Since the same RF-based tool is employed for both the planarization etch and ion-assisted recess etch, there is no need to purchase and maintain two separate tools, as in the case illustrated by prior art FIGS. 1–3. Further, since the same RF-based tool is employed for both the planarization and ion-assisted recess etches, there is no need to move the wafer from one processing tool to the next (as is done between the CMP step and the RIE etch step of prior art FIGS. 2 and 3). Accordingly, less time is required for the planarization/recess etch sequence, which advantageously improves wafer throughput.

Figure 6:
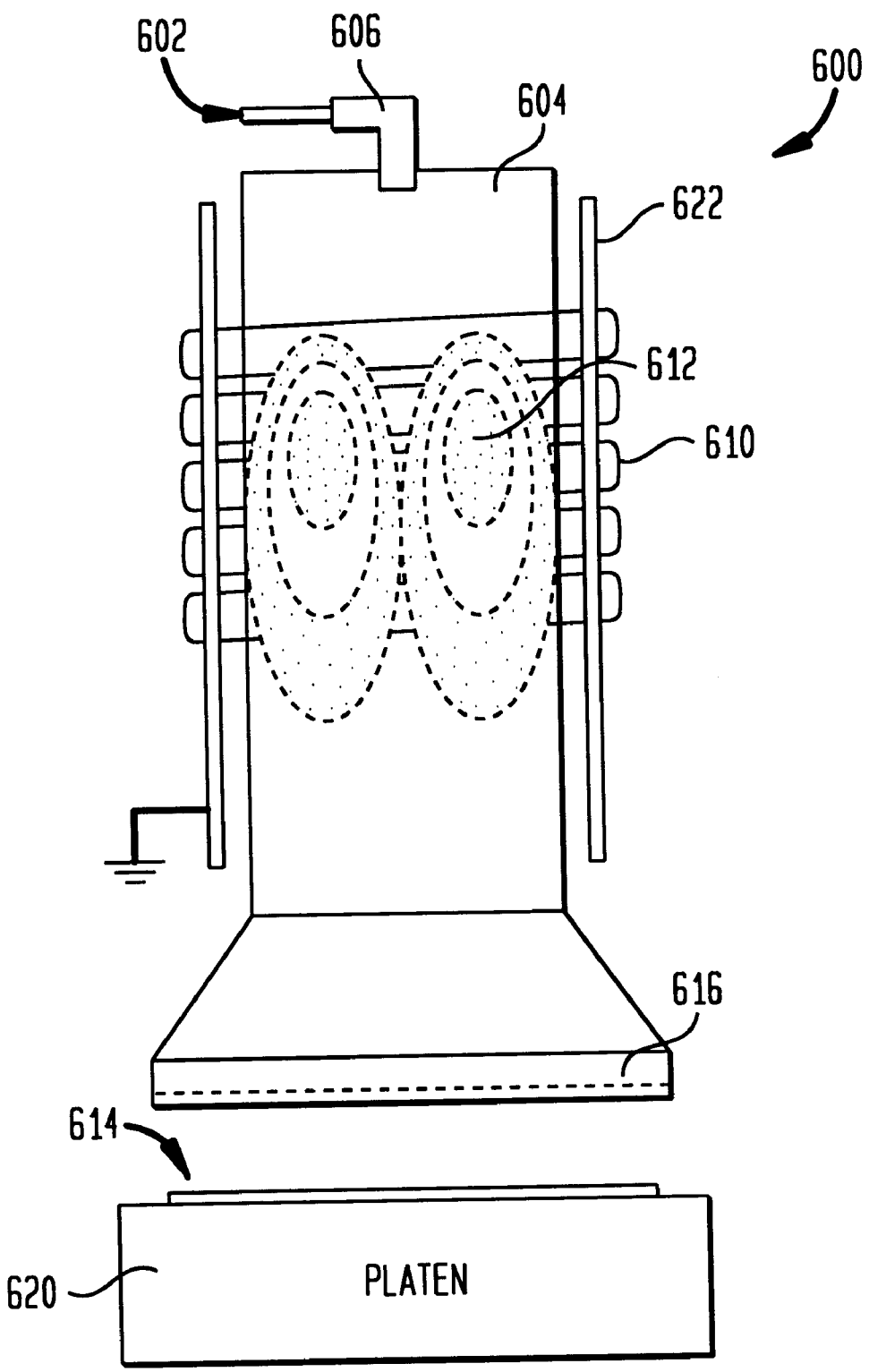
FIG. 6 illustrates a prior art inductively coupled plasma processing chamber.

The features and advantages of the present invention may be more clearly understood with reference to the figures that follow. FIG. 6 illustrates a prior art inductively coupled plasma processing chamber 600, representing a Mattson Technology inductively coupled plasma (ICP) chamber, which is available from Fremont, Calif.

As shown in FIG. 6, chamber 600 includes a gas inlet 602 for furnishing a reactant source gas into chamber 604 via coupler 606. A coil 610 inductively couples, when energized, with the reactant source gas within chamber 604 to form a plasma 612 to etch wafer 614. Between wafer 614 and plasma 612 there is shown an ion screen 616, whose function is to prevent the ion in plasma 612 from reaching wafer 614.

Wafer 614 is shown disposed on a uniform resistive heating platen 620, which functions to stabilize the temperature of wafer 614 during etching. A Faraday shield 622 in the form of a open-ended cylinder is disposed between coil 610 and outer wall 624 of chamber 604. Faraday shield 622, which is typically grounded in the prior art, prevents the electric field lines generated by coil 610 from penetrating into chamber 604. Accordingly, only magnetic field lines are permitted to penetrate into chamber 604 to couple with plasma 612.

Faraday shield 622 is made of a conductive material and is typically grounded, which blocks substantially all electric field lines from penetrating into chamber 604. Accordingly, few if any ions are generated in plasma 612. To the extent that any ions are generated, most of them are prevented by ion screen 616 from reaching wafer 614. Accordingly, the prior art inductively coupled plasma chamber 600 produces at all times a substantially isotropic etch in which the reactive neutrals represent the main etching mechanism.

Figure 7:
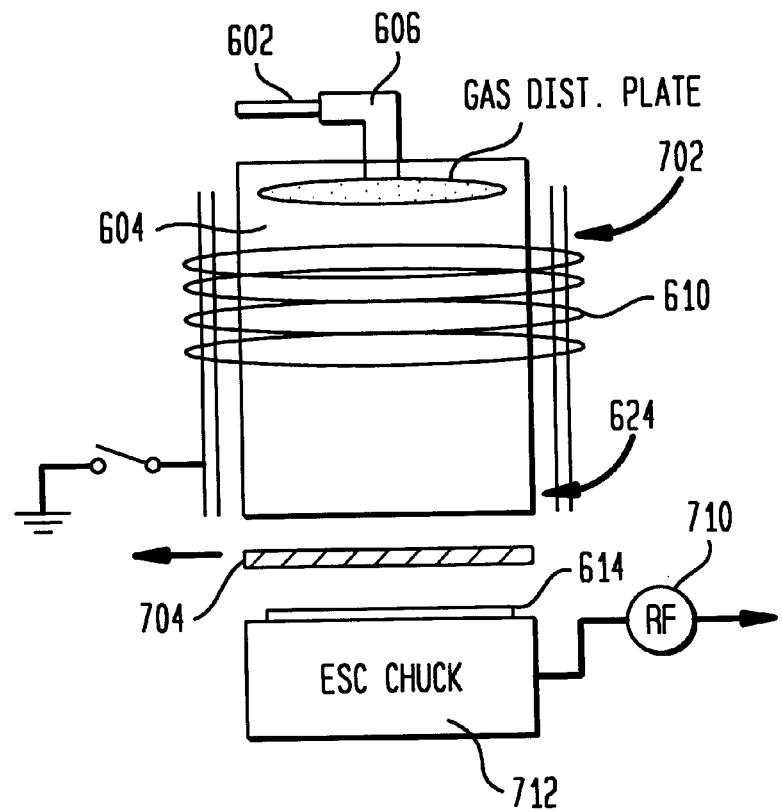
FIG. 7 illustrates, in accordance with one embodiment of the present invention, modifications to the aforementioned inductively coupled plasma chamber of FIG. 6 to facilitate the substantially isotropic planarization etch and the ion-assisted recess etch sequence.
Figure 4:
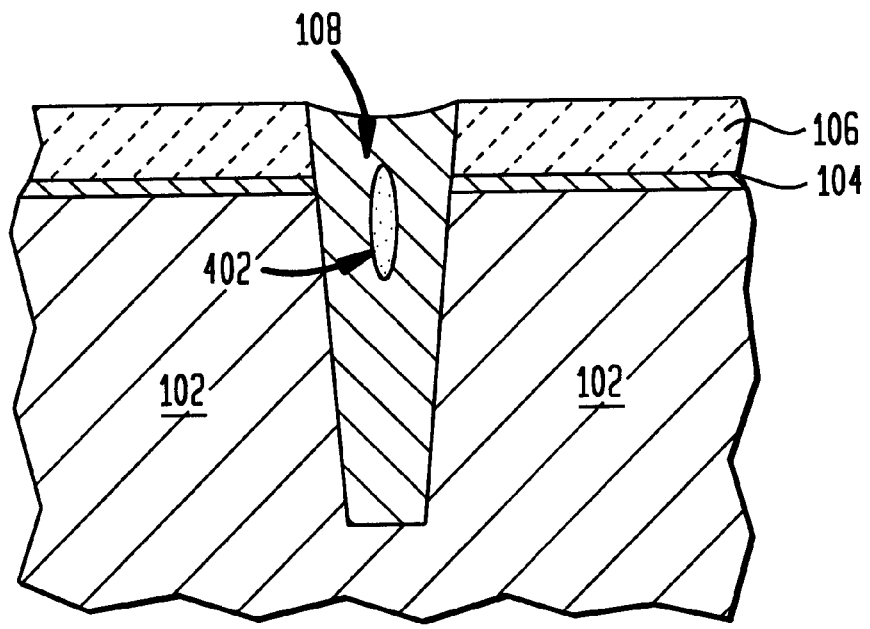
FIG. 4 illustrates the seams or voids that may be formed in the polysilicon plug during polysilicon deposition.
Figure 5:
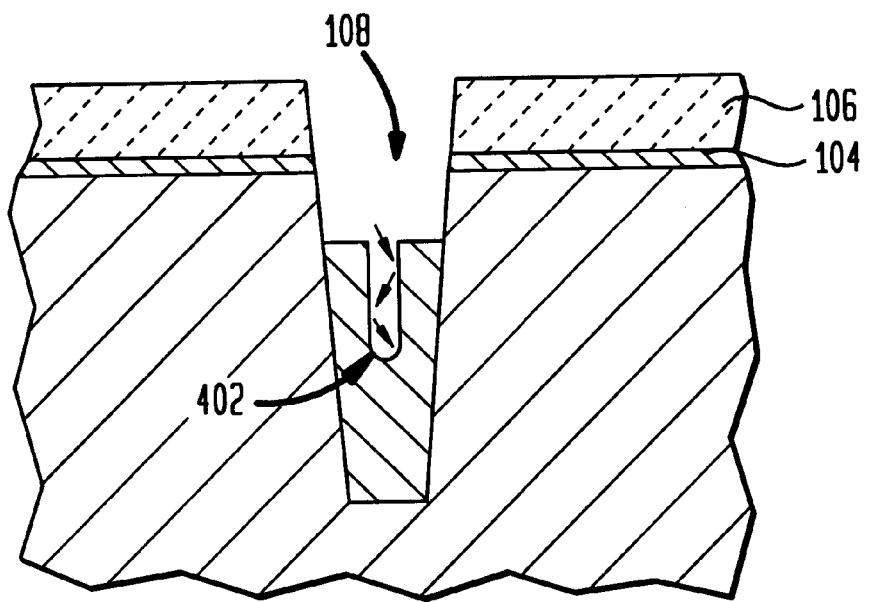
FIG. 5 illustrates the mechanism by which the seams or voids in the polysilicon plug may be amplified by the isotropic etch.

FIG. 7 illustrates, in accordance with one embodiment of the present invention, modifications to the aforementioned inductively coupled plasma chamber 600 of FIG. 6. The modifications advantageously permit the planarization and recess etch sequence to be performed in a single plasma processing chamber without requiring a CMP and/or RIE etch step. It should be borne in mind, however, that although the Mattson Technology etcher is employed herein to facilitate discussion, the invention is not limited to such an etcher and may in fact be practiced in any plasma processing chamber that is capable of varying the ion density and/or ion energy between the planarization etch and the recess etch steps.

In FIG. 7, a variable electric field shield 702 is disposed between coil 610 and outerwall 624 of chamber 604. Variable electric field shield 702 represents a shield that may be controlled to vary the strength of the electric field penetrating into chamber 604. To improve etch uniformity, an optional gas distribution plate may be employed to more evenly distribute the etchant source gas within the plasma processing chamber.

In one embodiment, variable electric field shield 702 represents any suitable variable electric field shield. Preferably, variable electric field shield 702 is implemented by a double Faraday shield, i.e., two Faraday shields nested within one another. At least one (or even both) of the Faraday shields may be provided with one or more apertures, e.g., slits or holes. By rotating the shields relative to one another, a variable area of outerwall 624 is exposed for electric field penetration. In this manner, the amount of capacity coupling and ion generation within chamber 604 may be varied.

Alternatively and/or additionally, variable electric field shield 702 may also be configured to operate in either the floating or grounded modes. When variable electric field shield 702 is grounded, more of the generated electric field lines are absorbed, and capacitive coupling is substantially reduced. In the floating mode, capacitive coupling is increased, concomitantly increasing the amount of ions generated within chamber 604, thereby rendering the etch therein more physical and anisotropic.

Ion screen 704 represents an ion screen that permits a variable amount of ion to pass through from chamber 604 to wafer 706. In one embodiment, variable ion screen 704 represents a movable ion screen, which may be moved to expose wafer 706 to more of the ions generated in chamber 604.

An RF power supply 710 furnishes RF energy to an electrostatic chuck 712. In one embodiment, RF power supply 710 represents a 12.56 MHz RF power supply. By varying the amount of RF power supplied to ESC chuck 712, the energy of the ion generated may be varied to increase or decrease the vertical directionality of the etch, i.e., rendering the etch more or less isotropic. Varying the amount of RF power supplied to the chuck represents an additional or alternative mechanism for changing the character of the etch process within chamber 604 to perform either the substantially isotropic planarization etch or the more physical recess etch.

In accordance with one embodiment of the present invention, the planarization etch is performed with a lower ion density than the ion density employed to perform the ion-assisted recess etch. By way of example, variable electric field shield 702 may be configured (i.e., by rotating the Faraday shields relative to one another) to minimize the electric field penetration into chamber 604, thereby substantially eliminates the capacitive coupling mechanism and reduces the amount of ions generated within chamber 604 during the planarization etch. As can be appreciated by those skilled in the art, the minimization of ion generation renders the etch substantially isotropic during the planarization etch. Alternatively or additionally, the ion density generated within the plasma processing chamber may be lowered by grounding the Faraday shield. Alternatively or additionally, the planarization etch may be performed with a lower level of ion energy than the level of ion energy employed in the ion-assisted recess etch. The lower level of ion energy during the planarization etch may be achieved by, for example, changing the amount of RF power supplied to ESC chuck 712.

Figure 1:
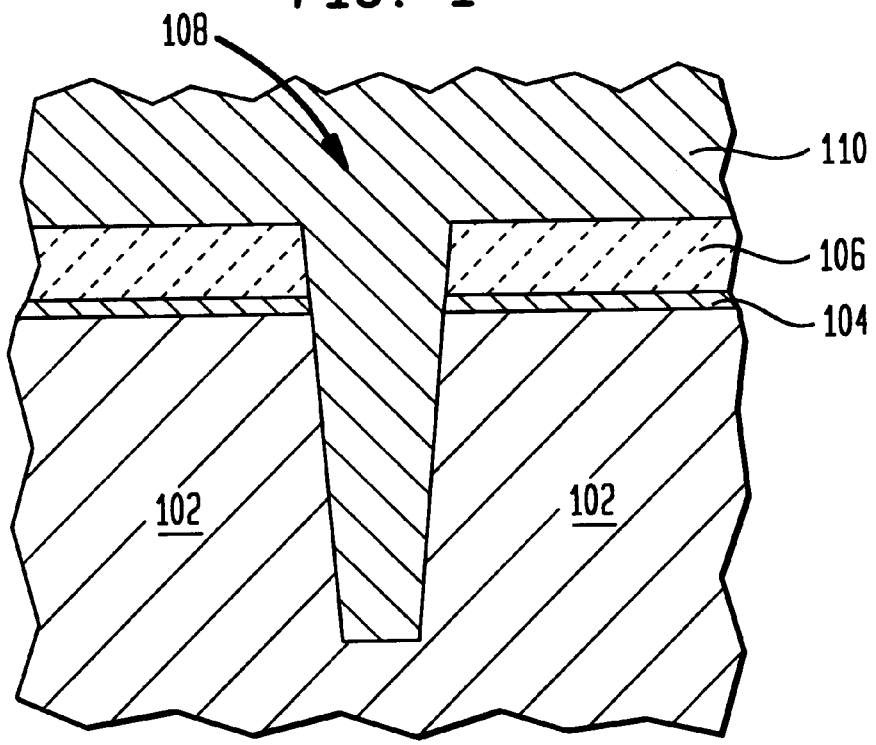
FIGS. 1–3 depicts the prior art process of CMP planarization and RIE recess etch in the fabrication of a trench capacitor.
Figure 8:
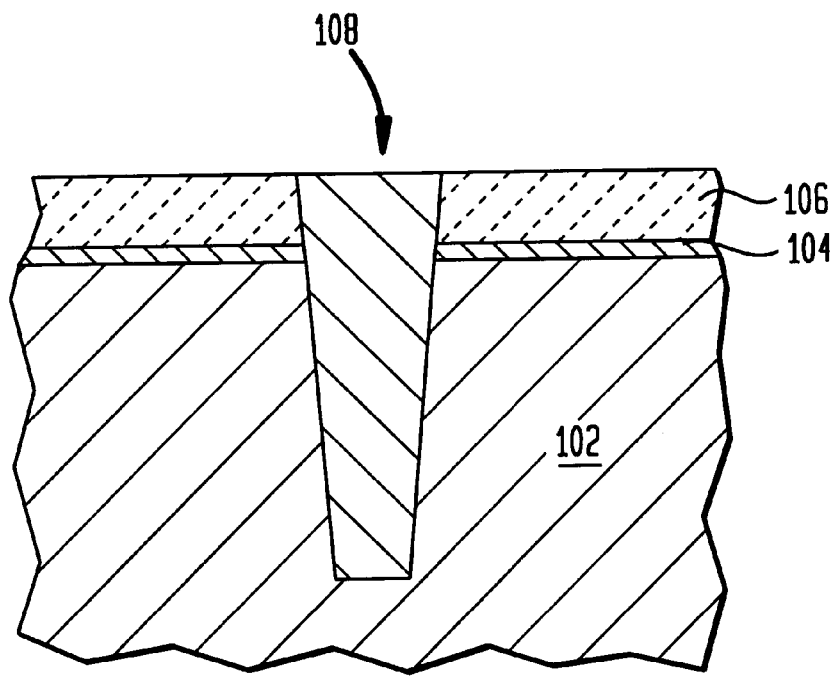
FIG. 8 illustrates, in accordance with one aspect of the present invention, the wafer of FIG. 1 after a substantially isotropic etch has been employed to planarize the polysilicon layer.
Figure 9:
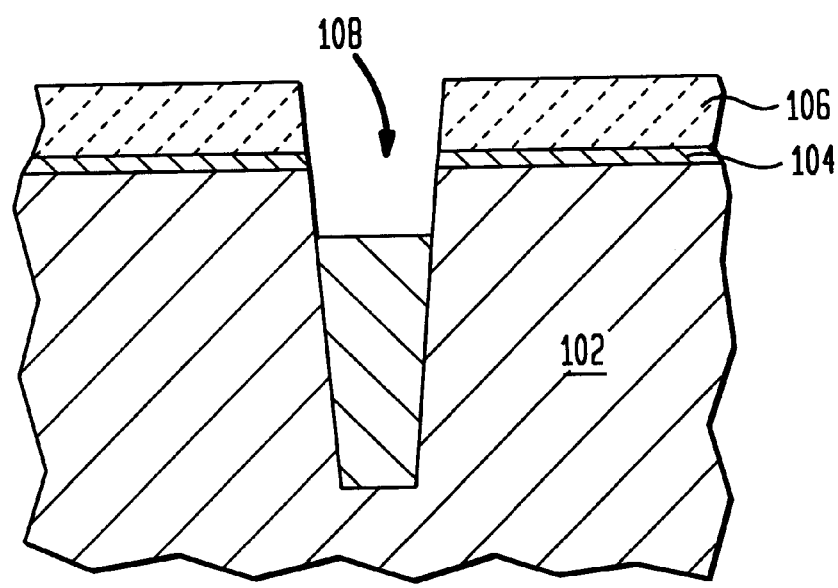
FIG. 9 illustrates, in accordance with one aspect of the invention, the polysilicon plug within the trench after the ion-assisted recess etch has been performed.

FIGS. 8–9 illustrate, in accordance with one embodiment of the present invention, the inventive planarization/recess etch sequence. After the formation of the trench and the deposition of the polysilicon material into the trench and over the wafer surface (as shown in FIG. 1), the variable ion chamber 700 is configured to perform a substantially isotropic etch, i.e., using a low ion density and/or ion energy level. The planarization etch is preferably performed using an etchant that is selective to the underlying nitride layer. In one embodiment, an etchant source gas comprising $CF_4/O_2$ is employed in both the planarization etch and the ion-assisted recess etch. Since CMP is not employed for planarization, dishing or nonuniform pad nitride erosion is substantially minimized. This is particularly advantageous if the planarization/recess etch sequence must be performed repeatedly, e.g., while fabricating a deep trench capacitor.

After the polysilicon layer is planarized in FIG. 8, an ion-assisted recess etch employing a higher level of ion density and/or ion energy is employed to recess back the column of polysilicon within the trench. In one embodiment, the increased level of ion density and/or ion energy of the ion-assisted recess etch may be accomplished by configuring variable electric field shield 702 to permit more of the electric field lines to penetrate chamber 604 to capacitively couple with the plasma therein. In this manner, more ions are created in the plasma to impart more directionality to the ion-assisted recess etch.

Other mechanisms also exist to increase the ion density and/or ion energy within the plasma processing chamber. With reference to FIG. 7, RF power supply 710 may be configured, additionally or alternatively, to increase the bias to ESC chuck 712 to increase the ion energy to render the etch more anisotropic. Additionally or alternatively, variable ion screen 704 may be configured to permit more ions to reach wafer 706, i.e., by moving variable ion screen 704 out of the way, to render the etch more anisotropic. Additionally or alternatively, variable electric field shield 702 may be ungrounded or floated to increase the amount of capacitive coupling, thereby generating more ions within chamber 604. The result of the ion-assisted recess etch is shown in FIG. 9.

EXAMPLE

In one example, a 200 mm wafer having thereon Aa 3,000 angstroms thick polysilicon layer disposed above a silicon nitride layer and into a 8-microns deep trench (which has an aspect ratio of 32:1. The polysilicon is recessed into the trench to a depth of 1.5 microns +/−0.2 micron Table 1 below illustrates the approximate values suitable for performing the substantially isotropic planarization etch and the ion-assisted recess etch of the polysilicon on such a wafer. Note that the values illustrated are optimized to be used in the Shibaura CDE 80 system, available from Shibaura Corp. of Japan. Optimization of the disclosed values to suit the requirements of different tools is within the skills of those skilled in the art given this disclosure.

TABLE 1

| PARAMETER | PLANARIZATION ETCH | RECESS ETCH |
|---|---|---|
| O$_2$ Flow (sccm) | 420–480 | 490–520 |
| CF$_4$ Flow (sccm) | 60–100 | 10–40 |
| N$_2$ Flow (sccm) | 20–40 | — |
| Cl$_2$ Flow (sccm) | 5–10 | — |
| Pressure (Pa) | 20–80 | 20–80 |
| Power (W) | 650–750 | 650–750 |
| Time (seconds) | 100 | 35 |
| Chuck Temperature (° C.) | 50–80 | 50–80 |

As can be appreciated from the foregoing, the invention advantageously eliminates the expensive chemical-mechanical polish step (and the required tool therefor). Accordingly, CMP-related problems of the prior art planarization/recess etch sequence are advantageously eliminated. By way of example, the CMP-induced dishing effect shown in FIG. 2 has been eliminated when the CMP etch step is substituted by the substantially isotropic planarization etch. The absence of the dishing phenomenon improves etch depth control in the subsequent recess etch.

The elimination of the CMP step also minimizes erosion of the silicon nitride layer since the low ion, substantially isotropic planarization etch has a greater selectivity to silicon nitride than the prior art CMP planarization etch step. Since the nitride layer is no longer employed as a chemical-mechanical polish etch stop layer, there is less wear of the silicon nitride layer. This is more important in applications wherein multiple planarization/recess etch sequences must be performed, e.g., in the fabrication of trench capacitors for DRAMs.

As mentioned, the use of a single plasma processing chamber to perform both the planarization etch and the ion-assisted recess etch advantageously reduces the wafer process time since the wafer no longer needs to be moved from one tool to another. In multiple planarization/recess etch sequence applications, the time savings may be substantial.

Additionally, the use of an ion-assisted recess etch step to recess the polysilicon column advantageously minimizes amplification of seams or voids in polysilicon. The increase in ion density and/or ion energy in the ion-assisted recess etch step increases the directionality of the etch, thereby minimizing lateral attacks on seams or voids, thereby yielding improved etch depth control.

Since the ion-assisted recess etch step employs a lower level of ion density and/or ion energy than the level employed during the prior art RIE recess etch, less bombardment is experienced by the wafer during the ion-assisted recess etch step. The reduced bombardment advantageously renders the etch less physical and more selective to silicon nitride than the prior art RIE recess etch. Further, a lower level of ion energy and/or ion density also minimizes the possibility of device damage due to charging during ion-assisted recess etch.

While this invention has been described in terms of several embodiments, there are alterations, permutations, and equivalents which fall within the scope of this invention. It should be noted that although the planarization and recess etch sequence is employed herein to facilitate discussion, the invention may also be applied to any process sequence which requires two consecutive etches, one of which being more isotropic than the other. By way of example, the invention may be employed to perform trench etching and photoresist stripping afterwards in a single plasma processing chamber. As another example, the invention may be employed to perform resist planarization and recess. As a further example, the invention may be employed in forming polysilicon studs on a wafer. It is therefore intended that the following appended claims be interpreted as including all such alterations, permutations, and equivalents as fall within the true spirit and scope of the present invention.

What is claimed is:

1. A method for processing a semiconductor wafer in an RF-based plasma processing chamber, the method comprising:

placing said semiconductor wafer, including a trench formed therein, into said plasma processing chamber;

depositing a first layer over a surface of said semiconductor and into said trench;

performing a substantially isotropic planarization etch in said plasma processing chamber, said planarization etch substantially removing portions of said first layer from above said surface thereby substantially planarizing said wafer, said planarization etch being performed with a first ion density level; and without removing the wafer from the plasma processing chamber, after performing said planarization etch, using said plasma processing chamber to perform a recess etch on said first layer to recess said first layer within said trench, said recess etch being performed with a second ion density level in said plasma processing chamber, said second ion density level being higher than first ion density level, the recess etch being more anisotropic than the planarization etch.

2. The method of claim 1 wherein said first layer represents a polysilicon layer.

3. The method of claim 2 wherein said surface includes a silicon nitride layer, said silicon nitride layer being disposed below said polysilicon layer after said depositing.

4. The method of claim 2 wherein said trench represents a trench for forming a trench capacitor.

5. The method of claim 1 further comprising:

adjusting a variable electric field shield of said plasma processing chamber to increase a level of electric field penetration into said plasma processing chamber, thereby generating said second ion density level.

6. The method of claim 5 wherein said plasma processing chamber represents an inductively coupled plasma processing chamber.

7. The method of claim 1 wherein said planarization etch and said recess etch employs CF$_4$.

8. The method of claim 1 further comprising:

moving an ion-shield to expose more of said wafer to a plasma within said plasma processing chamber, thereby permitting more ions to reach said wafer during said recess etch.

9. The method of claim 1 further comprising:

increase a potential supplied to an electric field shield of said plasma processing chamber to increase a level of electric field penetration into said plasma processing chamber, thereby generating said second ion density level.

10. A method for processing a semiconductor wafer, the method comprising:

depositing an oxide layer over the semiconductor wafer;

depositing a nitride layer over the oxide layer;

etching a trench within said semiconductor wafer, the oxide layer and the nitride layer remaining over an unetched portion of the semiconductor wafer;

depositing a semiconductive layer over the nitride layer and into said trench;

performing a substantially isotropic planarization etch within an RF-based plasma processing chamber, the planarization etch substantially removing the semiconductive layer from over the nitride layer, said planarization etch being performed with a first ion density level;

adjusting at least one condition of the plasma processing chamber such that a subsequent etch process will be performed with a second ion density level, said second ion density level being higher than first ion density level;

without removing the wafer from the plasma processing chamber, after performing said planarization etch, using said plasma processing chamber to perform a recess etch on semiconductive layer to recess said semiconductive layer within said trench, said recess etch being performed with said second ion density level in said plasma processing chamber, the recess etch being more anisotropic than the planarization etch.

11. The method of claim 10 wherein said first layer represents a polysilicon layer.

12. The method of claim 11 wherein said trench represents a trench for forming a trench capacitor.

13. The method of claim 10 further comprising:

adjusting a variable electric field shield of said plasma processing chamber to increase a level of electric field penetration into said plasma processing chamber, thereby generating said second ion density level.

14. The method of claim 13 wherein said plasma processing chamber represents an inductively coupled plasma processing chamber.

15. The method of claim 10 wherein said planarization etch and said recess etch employs $CF_4$.

16. The method of claim 10 further comprising:

moving an ion-shield to expose more of said wafer to a plasma within said plasma processing chamber, thereby permitting more ions to reach said wafer during said recess etch.

17. The method of claim 10 further comprising:

increase a potential supplied to an electric field shield of said plasma processing chamber to increase a level of electric field penetration into said plasma processing chamber, thereby generating said second ion density level.

18. The method of claim 1 wherein the recess etch is selective to remove the first layer within the trench without substantially removing portions of the surface of the semiconductor wafer.

19. The method of claim 1 wherein a bias voltage is increased after performing the planarization etch and before performing the recess etch.

20. The method of claim 12 wherein adjusting at least one condition of the plasma processing chamber comprises increasing a bias voltage.

* * * * *